United States Patent [19]
Greer et al.

[11] Patent Number: 5,039,957
[45] Date of Patent: Aug. 13, 1991

[54] HIGH POWER SURFACE ACOUSTIC WAVE DEVICES HAVING COPPER AND TITANIUM DOPED ALUMINUM TRANSDUCERS AND LONG-TERM FREQUENCY STABILITY

[75] Inventors: James A. Greer, Andover; Thomas E. Parker, Framingham; Gary K. Montress, Westford, all of Mass.

[73] Assignee: Raytheon Company, Lexington, Mass.

[21] Appl. No.: 520,012

[22] Filed: May 7, 1990

[51] Int. Cl.$^5$ .................. H01L 41/04; H03B 5/32; H03H 9/145

[52] U.S. Cl. ........................... 331/107 A; 310/313 A; 310/313 B; 310/313 D; 310/363; 333/154; 333/193; 333/195

[58] Field of Search ............... 331/107 A; 310/313 A, 310/313 R, 313 B, 313 C, 313 D, 363; 333/154, 151, 193, 194, 195

[56] References Cited

U.S. PATENT DOCUMENTS

| 4,422,055 | 12/1983 | Cullen et al. | 310/313 R |
| 4,639,697 | 1/1987 | Yarranton et al. | 331/107 A X |
| 4,775,814 | 10/1988 | Yuhara et al. | 310/313 R |

OTHER PUBLICATIONS

Yamada, J. et al. "Sputtered Al-Ti Electrodes For High Power Durable SAW Devices", Proceedings of the IEEE Ultrasonics Symposium, Oct. 2-5, 1988, vol. I, pp. 285-290.

Yuhara, A. et al., "Sputter Deposition for High Power Durable SAW Electrodes", Proceedings of 8th Symp. on Ultrasonic Electronics, Tokyo, Dec. 1987 Japanese Journal of Applied Physics, vol. 27, Supp. 27-1, pp. 172-174.

Hosaka, N. et al., "A Study of Al-Alloy Electrodes for High Power SAW Filters", Proceedings of 8th Symposium on Ultrasonic Electronics, Tokyo Dec. 1987 Japanese Journal of Applied Physics, vol. 27 (1988) Supplement 27-1, pp. 175-177.

Primary Examiner—Siegfried H. Grimm
Attorney, Agent, or Firm—Denis G. Maloney; Richard M. Sharkansky

[57] ABSTRACT

A surface acoustic wave device having interdigitated transducers comprised of an improved metalization system including copper and titanium doped aluminum transducers. A method of producing the interdigitated transducers includes deposition of the metals on a quartz substrate and subsequent heat treatment. The metalization system provides SAW devices having improved long-term frequency stability, particularly when operated at high power levels. The surface acoustic wave device may be incorporated in a feedback loop of an amplifier to form an oscillator circuit.

16 Claims, 4 Drawing Sheets

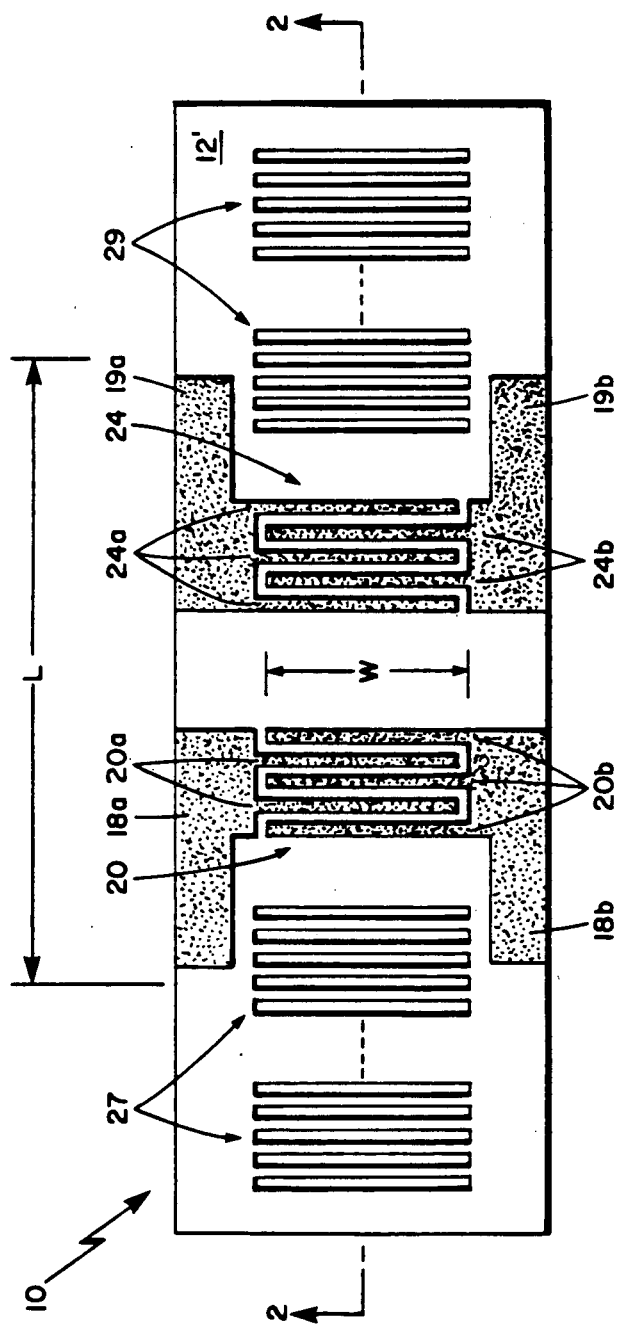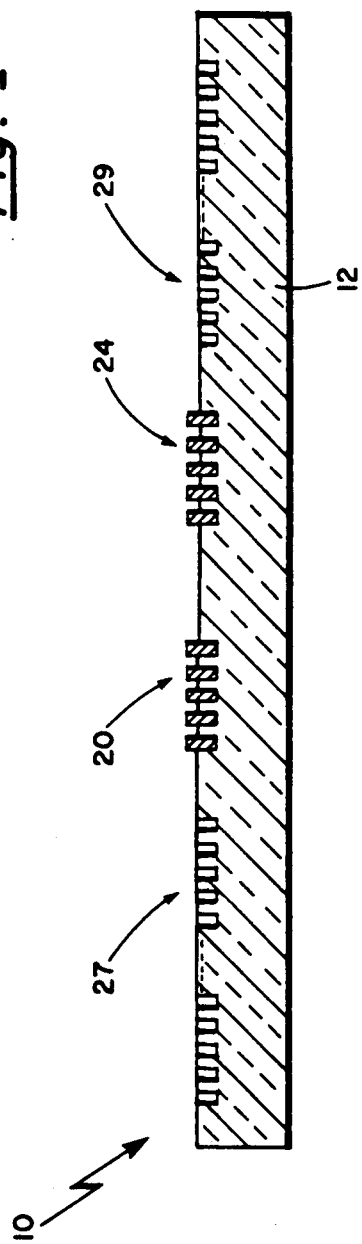

HIGH POWER SURFACE ACOUSTIC WAVE DEVICES HAVING COPPER AND TITANIUM DOPED ALUMINUM TRANSDUCERS AND LONG-TERM FREQUENCY STABILITY

BACKGROUND OF THE INVENTION

This invention relates generally to surface acoustic wave devices and more specifically to surface acoustic wave devices operated under relatively high power conditions.

As it is known in the art, surface acoustic wave (SAW) devices, such as resonators and delay lines, are used in a variety of applications. Generally, a surface acoustic wave device includes a pair of interdigitated transducers (IDTs) which are the input and output ports of the device with each transducer having a set of conductive members, typically comprised of metal. The conductive members are disposed on, or recessed within, an upper portion of a surface of the device which supports surface acoustic wave propagation.

As it is also known in the art, many applications for radar systems employ SAW devices in oscillator circuits, particularly SAW resonator devices. SAW devices other than SAW resonators, for example SAW delay line devices, could alternately be used in oscillator circuit applications. However, for certain applications SAW resonators are more desirable since they offer a higher quality factor "Q" and therefore better frequency stability characteristics than SAW delay line devices. Such oscillator applications place stringent requirements on the SAW device, particularly with respect to minimizing flicker noise and noise floor levels. Flicker noise refers to the instantaneous fluctuations of the resonant frequency of a device. In a spectral analysis, which represents energy as a function of an offset frequency, "f", flicker noise is the portion of the spectrum which falls off at a rate of 1/f. The oscillator noise floor level is a function of the signal power handling capability of the SAW device. In particular, the noise floor level refers to the ratio of the signal power to the constant thermal, or white, noise level. The larger the signal power, with respect to the constant thermal noise level, the lower the noise floor of the oscillator. In order to meet the stringent noise floor requirements of certain oscillator circuits, the SAW device must operate under relatively high power conditions. For example, the SAW device may be subjected to a typical power level of +18 dBm, this value commonly referred to as the incident power on a device. Approximately half of the incident power on a device (measured in watts) is dissipated, or lost as heat, within the device, and a factor of two decrease in watts is approximately equivalent to a decrease of 3 dB. Thus, given an incident power level of +18 dBm, or approximately 64 milliwatts incident on a device, +15 dBm, or approximately 32 mW, is dissipated within the device.

As it is also known in the art, the high power operating conditions required of SAW devices used in oscillator applications can be detrimental to the long-term frequency stability characteristics of such devices. Long-term frequency stability refers to the variation of the frequency characteristics of a device over time and is typically a critical device parameter. Long-term frequency stability is measured in parts per million per year (ppm/year) and a typical requirement for high precision SAW devices used in oscillator circuit applications is a variation of less than about 1 ppm/year.

Conventionally, in order to provide high power SAW devices having acceptable long-term frequency stability characteristics, the interdigitated transducers of such devices have been comprised of aluminum doped with copper. However, in order to meet more stringent noise floor requirements, particularly of oscillator circuits which utilize SAW devices, such devices must operate with an incident power level of +24 dBm, which is equivalent to +21 dBm (approximately 125 mW) dissipated in the device. While the long-term frequency stability characteristics of conventional SAW devices having copper doped aluminum interdigitated transducers, which are operated at an incident power level of +24 dBm, indicate an overall long-term frequency variation of less than about 1 ppm/year, these devices display significant random fluctuations over shorter durations which is cause for concern.

In articles entitled "A Study of Al-Alloy Electrodes for High Power SAW Filters" by N. Hosaka et al. published in the Japanese Journal of Applied Physics, Vol. 27 (1988) Supplement 27-1, pps. 175–177, "Sputter Deposition for High Power Durable SAW Electrodes" by A. Yuhara et al. published in the Japanese Journal of Applied Physics, Vol. 27 (1988) Supplement 27-1, pps. 172–174, and "Sputtered Al-Ti Electrodes for High Power Durable SAW Devices" by J. Yamada et al. published in the Proceedings of the 1988 Ultrasonics Symposium, Vol. 1 (1988), pps. 285–290, titanium doped aluminum electrodes, or transducers, are used to provide more "durable" SAW devices with respect to stresses and subsequent device failures which generally accompany high power and high frequency operation. Time to failure, or the aging time at which the shift of the center frequency of the device reaches 50 kHz, is one of the parameters used by the above mentioned authors to evaluate the durability of SAW devices. However, while the SAW devices provided by the authors may be suitable for the described portable telephone duplexer application, they do not exhibit acceptable long-term frequency stability characteristics for use in radar system oscillator circuit applications.

It would be desirable to provide SAW devices capable of withstanding high incident power as well as high power dissipation and having improved long-term frequency stability characteristics suitable for use in such applications as radar system oscillator circuits, which demand high power operation as well as stringent long-term frequency stability characteristics of SAW devices.

SUMMARY OF THE INVENTION

In accordance with the present invention, a surface acoustic wave device includes a surface which supports surface acoustic wave propagation having disposed thereon at least one interdigitated transducer (IDT) coupled to the surface acoustic wave propagation surface. The at least one transducer is comprised of aluminum doped with copper and titanium. With such arrangement, devices capable of withstanding high incident and dissipated power levels have improved long-term frequency stability characteristics.

In accordance with a further aspect of the present invention, a method of providing surface acoustic wave devices capable of withstanding high incident and dissipated power levels and having improved long-term frequency stability characteristics includes the steps of providing a substrate having a surface which supports surface acoustic wave propagation and providing at least one interdigitated transducer supported by said surface. The step of providing at least one interdigitated transducer further includes the steps of depositing a first layer of titanium over said surface, depositing a second layer of aluminum doped with a predetermined percentage with copper over said first layer, and heating the SAW device to an elevated temperature for a predetermined period of time. With such an arrangement, a SAW device is provided having transducers comprised of titanium, aluminum, and copper, which is capable of withstanding high incident and dissipated power levels while providing improved long-term frequency stability characteristics.

BRIEF DESCRIPTION OF THE DRAWINGS

The foregoing features of this invention, as well as the invention itself, may be more fully understood from the following detailed description of the drawings, in which:

FIG. 1 is a plan view of a SAW resonator device;

FIG. 2 is a cross-sectional view taken along line 2—2 of FIG. 1;

DESCRIPTION OF THE PREFERRED EMBODIMENTS

Figure 3:
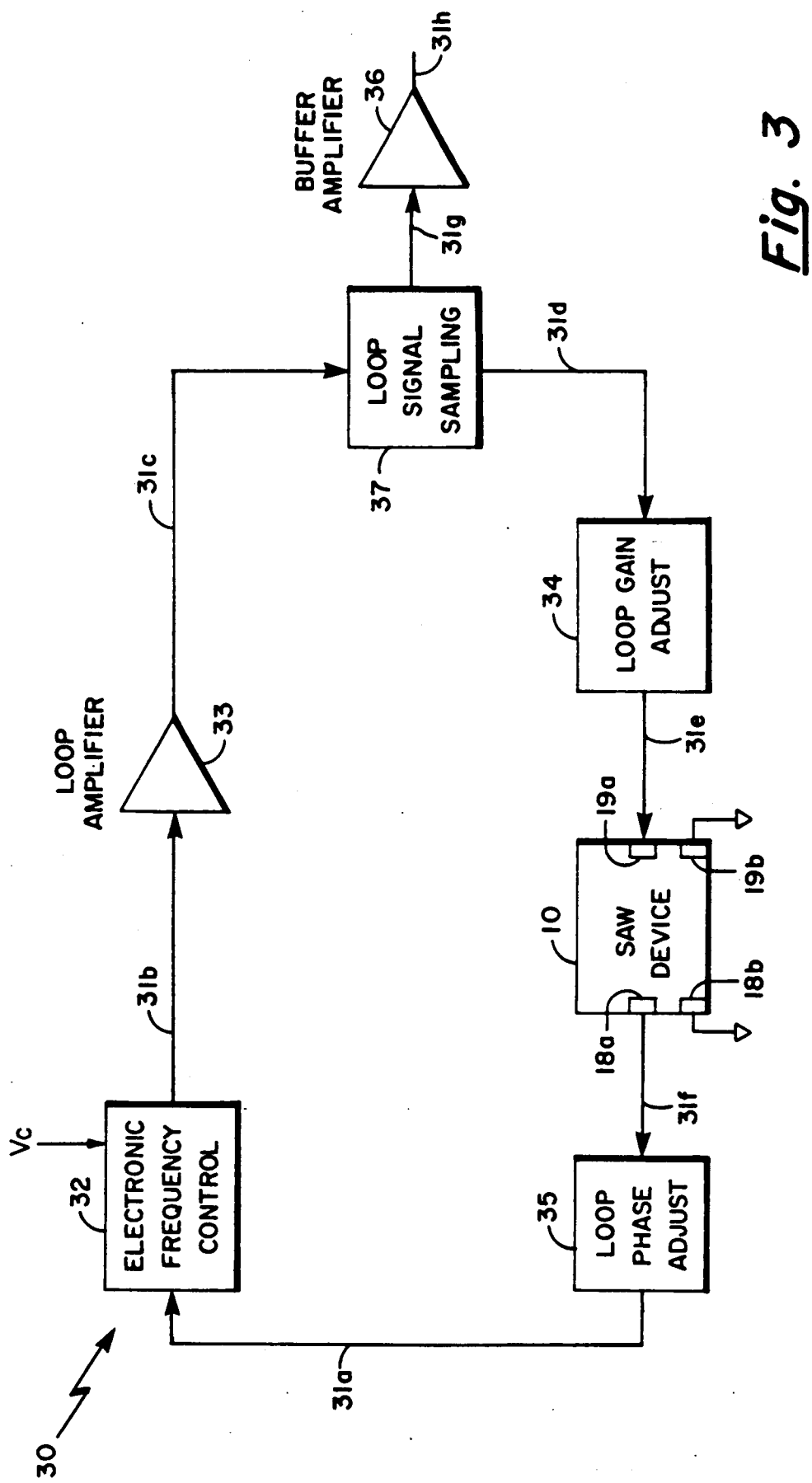
FIG. 3 is a simplified block diagram of an oscillator circuit including a SAW resonator device as the frequency stabilizing element of the circuit.

Referring now to FIGS. 1 and 2, a SAW device, here a resonator 10, includes a substrate 12 having a surface 12' which supports surface acoustic wave propagation. Substrate 12 is here a rotated Y-cut of quartz, which also includes ST-cut quartz, or other substrate materials may alternately be used. Substrate 12 supports at least one interdigitated transducer (IDT), here one pair 20 and 24, but more than one pair may be used in a parallel configuration in order to increase the power handling capability of the SAW resonator device 10. The substrate 12 further supports two sets of reflective gratings 27 and 29. The interdigitated transducers 20 and 24 are the input and output ports of the device and the reflective gratings 27 and 29 act as "mirrors" for the acoustic energy. By reflecting acoustic energy, the reflective gratings 27 and 29 confine such energy to the center of the SAW device 10. The interdigitated transducers 20 and 24 are each comprised of conductive members 20a, 20b, and 24a, 24b coupled to the respective one of bus bars 18a, 18b, and 19a, 19b as shown. In operation, conductors or bus bars 19a and 18a are the input and output ports respectively for signals propagating through the device 10 and bus bars 18b and 19b are coupled to a reference potential. The thickness of the conductive members 20a, 20b, and 24a, 24b, is determined by the desired device characteristics. Here, a conventional metal thickness of between 1.0% and 1.2% of the acoustic wavelength at the center frequency of the device is used, however, other thicknesses may alternately be used. In particular, the metal of the conductive members 20a, 20b and 24a, 24b may have a thickness between 1.5% and 2.0% of the acoustic wavelength at the center frequency of the device. The width (labelled W) of the conductive members 20a, 20b, and 24a, 24b is referred to as the acoustic aperture of the device. For a given amount of power, the acoustic aperture dimension determines the power density, such that the larger the acoustic aperture, the lower the power density. Since the stresses developed in the device are directly proportional to the square root of the power density, which in turn is inversely proportional to the acoustic aperture dimension, such stresses potentially resulting in inter alia increased frequency deviation over time. However, while a wider acoustic aperture will provide relatively lower stresses in a SAW device, the quality factor, Q, of the device is degraded with increased acoustic aperture width W. The effective cavity length (labelled L) refers to the effective distance between which acoustic waves are entirely reflected by reflective gratings 27 and 29, and is a function of the center frequency of the device and the dimensions of reflective gratings 27 and 29. Here the effective cavity length is 365 times frequency of the device.

The conductive members 20a, 20b and 24a, 24b may be supported on the surface 12' of the substrate 12 or may be recessed within grooves provided in the substrate 12. Here such conductive members 20a, 20b, and 24a, 24b are recessed within grooves in the substrate 12.

The conductive members 20a, 20b, and 24a, 24b are comprised of aluminum doped with copper and titanium. The composition of the resulting conductive members 20a, 20b and 24a, 24b is between 0.1% and 5.0% titanium, between 0.1% and 1.0% copper, and the remaining 94.0%–99.8% is aluminum with a very small percentage of silicon, typically less than 0.5% silicon, which may migrate from the quartz substrate to the transducers during annealing. Here, the composition of the conductive members 20a, 20b and 24a, 24b is 0.5% copper, 1.0% titanium, with the remaining 97.5% aluminum with a small percentage of silicon as previously mentioned.

In order to provide acceptable long-term frequency stability characteristics (i.e. maintain variations less than about 1 ppm/year), SAW devices are generally subjected to an elevated temperature for a predetermined period of time prior to sealing the device in a suitable package. Here, the SAW device is sealed in a conventional all-quartz package as provided from Raytheon Company Special Microwave Device Operation, Northboro, Md., or Raytheon Research Division, Lexington, Md., or an equivalent. Also, here the SAW device is heated to a temperature in excess of 350° C., but below the $\alpha$-$\beta$ transition temperature of the material of the quartz substrate, and maintained at the elevated temperature for approximately one hour. This high temperature period has been shown to cause the titanium to diffuse into the copper doped aluminum layer, thus providing substantially uniform incorporation of the titanium throughout the copper doped aluminum layer. The resulting SAW device exhibits improved long-term frequency stability characteristics, particularly with respect to random fluctuations, at relatively high incident and dissipated power levels.

The conductive members 20a, 20b and 24a, 24b are here formed by a method which includes the steps of: evaporating titanium over the surface 12' of the substrate 12 which is to support surface acoustic wave propagation to a thickness of between 1 Å and 15 Å depending on the operating frequency of the device and depositing, over the titanium layer, a layer of copper doped aluminum. The layer of copper doped aluminum is deposited from a source of 95.5% Al and 4.5% Cu, here by a vacuum evaporation process. Due to differences in the vapor pressures of copper and aluminum, the 4.5% copper content in the source material will yield approximately 0.5% copper in the deposited layer.

Here, standard evaporation techniques are used to provide the titanium layer and the copper doped aluminum layer. However, it is believed that any deposition technique may be used to form the titanium layer and the copper doped aluminum layer in order to provide high power SAW devices having improved long-term frequency stability.

A SAW resonator device having Ti/Cu/Al transducers and formed by the method described above provides the benefit of improved long-term frequency stability at relatively high incident and dissipated power levels, without detrimental effects on device performance. The flicker noise level of devices thus fabricated has been found to be equivalent to that of devices having conventional copper doped aluminum transducers. However, in contrast to conventional Cu/Al transducers, the resistivity of Ti/Cu/Al transducers remains nominally the same after the devices have been subjected to the high temperature period. The resistivity of Cu/Al transducers typically decreases to about 70% of its initial value after having been subjected to the high temperature. The relatively higher resistance of Ti/Cu/Al IDTs may slightly increase the insertion losses of the device; however, the amount of possible increased insertion loss could be insignificant.

The reasons for the improved long-term frequency stability of the above described SAW resonators, having titanium and copper doped aluminum transducers, which permit SAW devices to operate at relatively high incident and dissipated power levels with little effect on noise characteristics are not fully understood at this time. One possibility is that the Ti/Cu/Al composition of the IDTs reduces the effects of electro-migration and acousto-migration. Acousto-migration is a phenomenon in which metal portions of a device are displaced due to mechanical vibrations and electro-migration refers to the displacement of such metal portions due to electric current.

Referring now to FIG. 3, a simplified block diagram of a high power SAW oscillator circuit 30 is shown. The oscillator circuit 30 includes an electronic frequency control circuit 32 which is fed by a control signal $V_c$ to tune the frequency of the oscillator 30. The electronic frequency control circuit 32 is coupled to a loop amplifier 33 by signal path 31b. Loop amplifier 33 is further coupled to a loop signal sampling circuit 37 via signal path 31c as shown. An output of loop signal sampling circuit 37 is coupled to a loop gain adjustment circuit 34 by signal path 31d. The loop gain adjustment circuit 34 is used to set the proper loop gain conditions for oscillation. The loop gain adjustment circuit 34 is further coupled to an input port 20 of a loop stabilizing SAW device by signal path 31e via signal conductor 19a, grounded conductor 19b. Here the SAW device is a SAW resonator 10 having input port 20 and output port 24 as described in conjunction with FIGS. 1 and 2. The output port 24, via signal conductor 18a, grounded conductor 18b, is further coupled to a loop phase adjustment circuit 35 by signal path 31f. The loop phase adjustment circuit 35 is used to set the proper loop phase conditions for oscillation. A second port of the loop phase adjustment circuit 35 is coupled to electronic frequency control circuit 32 via signal path 31a. A second output of the loop signal sampling circuit 37 is coupled to a buffer amplifier 36 by signal path 31g. Buffer amplifier 36 provides isolation to the feedback loop from load variations, the output of which provides the output of the circuit 30 via circuit path 31h.

Since some applications for the oscillator circuit 30 require low noise floor and flicker noise levels, selection of the various components of the oscillator circuit 30 is critical since each component may potentially contribute to the noise spectrum of the oscillator circuit 30. However, the electronic frequency control 32, the loop amplifier 33, the buffer amplifier 36, and particularly the SAW resonator device 10, have been found to be the more critical components with respect to their contribution to the noise spectrum of the oscillator circuit 30. Generally, the critical circuit components, other than the SAW device 10, are commercially readily available with acceptable noise characteristics. SAW oscillators built entirely with commercially available low noise amplifiers 33 and 36 and other low noise circuit components have demonstrated state of the art performance when high quality SAW resonator devices 10 are used.

Figure 4:
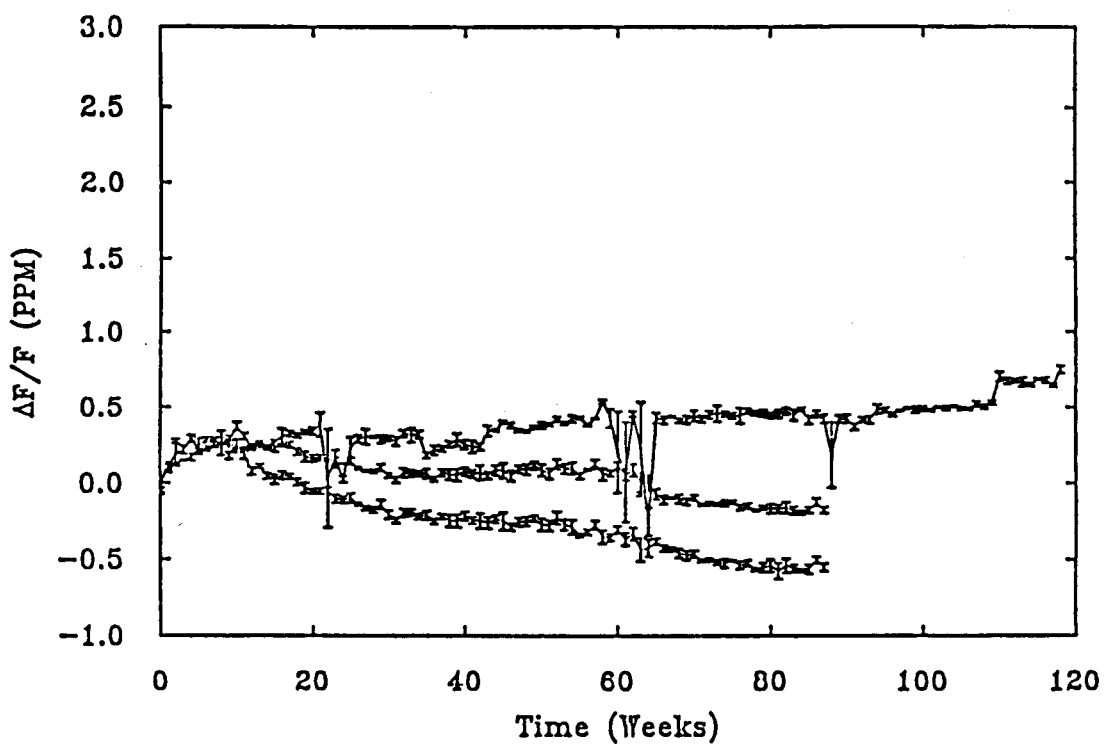
FIG. 4 is a plot of frequency deviation (in ppm) vs. time (in weeks) showing the long-term frequency stability characteristics of conventional Cu/Al SAW resonator devices operated at an incident power level of +18 dBm, or a dissipated power level of +15 dBm.

FIG. 4 shows the long-term frequency stability characteristics of three high power, SAW resonator devices having conventional transducers comprised of aluminum doped with copper. The frequency deviation is given in parts per million over varying durations given in weeks. Each data entry shows the variation in frequency which occurs during the particular week. The devices examined were operated at an incident power level of +18 dBm, equivalent to +15 dBm (0.032 watts) dissipated in the device, and have a relatively wide acoustic aperture, indicating relatively low stresses as described in conjunction with FIG. 1. Here the acoustic aperture is 300 times the acoustic wavelength at the center frequency of the device and the substrate is quartz, so that the acoustic wavelength at the center frequency of the device is approximately 3,159 micrometers divided by the center frequency of the device. As previously mentioned, the length of the acoustic aperture inversely influences the power density in the device, and also inversely influences the square of the stresses developed in the device. Here, the stresses within the device have a value of 50 MegaNewtons/meter$^2$ (MN/m$^2$). The determination of the level of such stresses is a function of power dissipation, unloaded quality factor, Q, acoustic aperture, W, and cavity length, L, and is described in a paper by W. R. Shreeve, et al. entitled "Power Dependence of Aging in SAW Resonators" in the Proceedings of the 1981 Ultrasonics Symposium, Vol. 1 (1981), pps. 94–99. As shown, these SAW resonators having transducers comprised of aluminum doped with copper provide acceptable long-term frequency deviation characteristics in terms of overall variation as well as in terms of short-term random frequency fluctuations. However, as described, current oscillator applications require that SAW devices operate with incident power levels of +24 dBm, or +21 dBm (0.125 watts) dissipated in the device.

Figure 5:
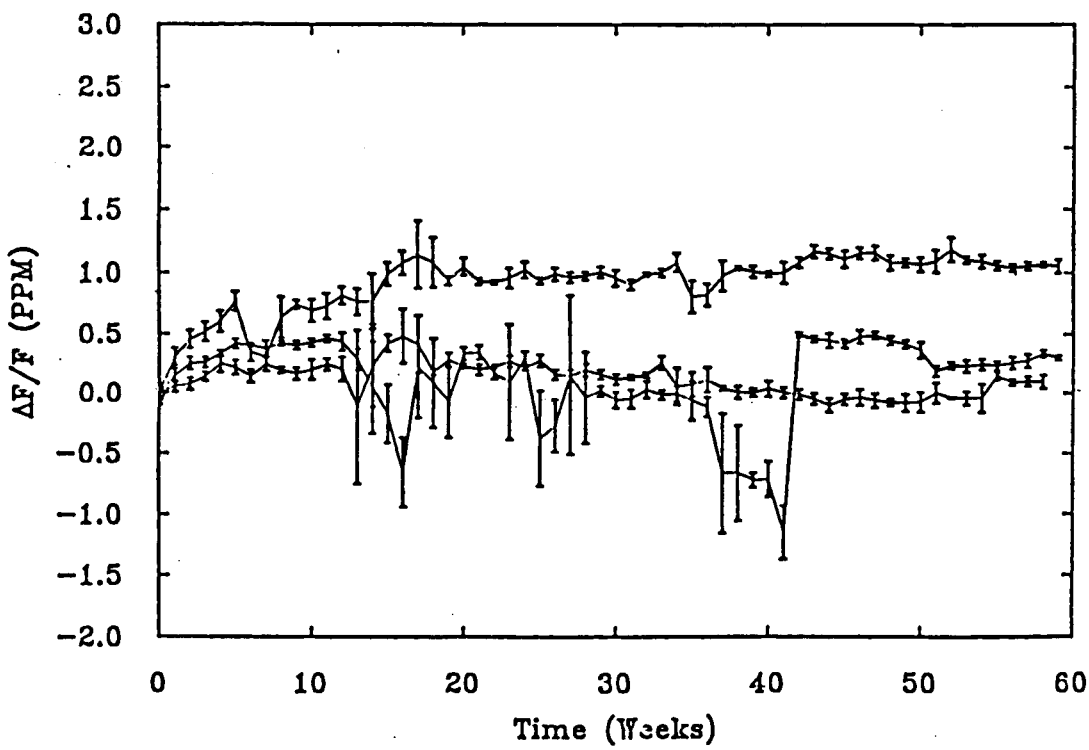
FIG. 5 is a plot showing the long-term frequency stability characteristics of conventional Cu/Al SAW resonator devices operated at an incident power level of +24 dBm, or a dissipated power level of +21 dBm.

FIG. 5 shows the frequency aging characteristics of the three wide aperture SAW resonator devices shown in conjunction with FIG. 4, here operated with an incident power level of +24 dBm, or +21 dBm (0.125 watts) dissipated in the device, and having a stress level of 100 MN/m$^2$. While the SAW resonator devices exhibit a long-term frequency deviation of less than about 1 ppm/year, the random fluctuations over shorter intervals (shown by the vertical lines between horizontal bars, which indicate the deviation of 5 data points taken in a single week) may be cause for concern. In some applications, particularly in oscillator circuit applications, such random frequency fluctuations are considered unacceptable.

Figure 6:
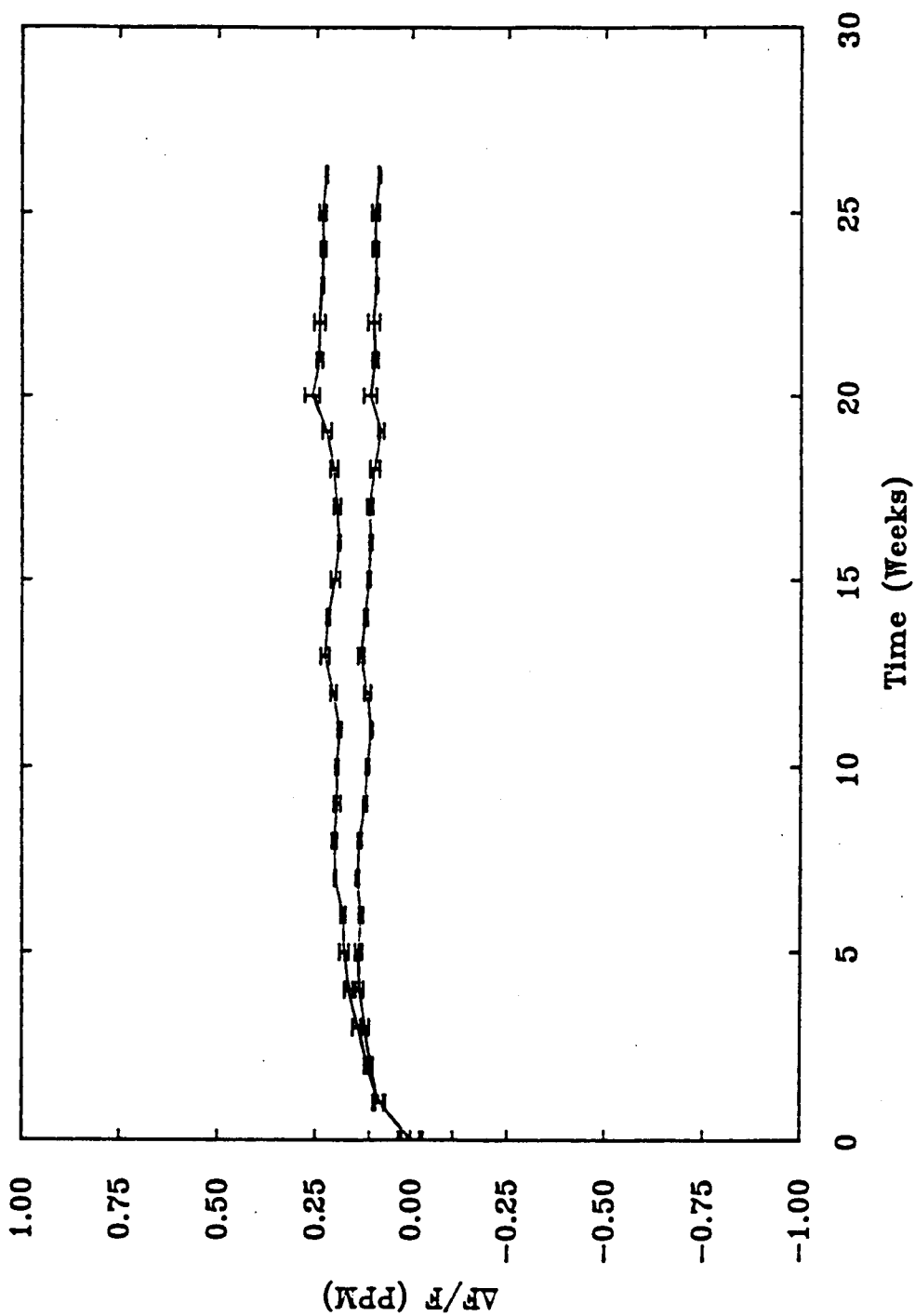
FIG. 6 is a plot showing the long-term frequency stability characteristics of Ti/Cu/Al SAW resonator devices in accordance with the present invention operated at an incident power level of +18 dBm, or a dissipated power level of +15 dBm.

FIG. 6 shows the frequency aging characteristics of two SAW resonator devices provided in accordance with the present invention. The SAW devices have transducers comprised of aluminum doped with titanium and copper, and are operated at a incident power level of +18 dBm, the equivalent of +15 dBm (0.032 watts) dissipated in the devices. Further, these SAW devices are provided with relatively narrow acoustic apertures which, as described in conjunction with FIG. 1, will inherently develop higher stress levels in the devices as compared with the wider acoustic aperture devices used to obtain the data shown in FIGS. 4 and 5. The Ti/Cu/Al devices having frequency characteristics as shown in FIG. 6 have an acoustic aperture width which is 150 times the acoustic wavelength at the center frequency of the device, which yields a peak stress level of 100 MN/m$^2$. The stress level of the conventional devices operated with an incident power of +24 dBm (FIG. 5) is the same as that of the devices provided in accordance with the present invention (FIG. 6), 100 MN/m$^2$. It is thus appropriate to compare the performance data of the conventional devices (FIG. 5) with that of the Ti/Cu/Al devices of FIG. 6, since if the Ti/Cu/Al devices were provided with a relatively wide acoustic aperture, an incident power level of approximately +24 dBm would result in a stress level equivalent to 100 MN/m$^2$. These devices display an improvement in both short-term, random frequency fluctuations, and long-term frequency fluctuations over similar SAW resonator devices with metal systems comprised of aluminum doped only with copper and having the same stress level of 100 MN/m$^2$, as shown in FIG. 5.

Having described preferred embodiments of the invention, it will now become apparent to one of skill in the art that other embodiments incorporating their concepts may be used. It is felt, therefore, that these embodiments should not be limited to disclosed embodiments but rather should be limited only by the spirit and scope of the appended claims.

What is claimed is:

1. A surface acoustic wave device comprising:
    a substrate having a surface which supports surface acoustic wave propagation; and
    at least one transducer supported by the surface acoustic wave propagation surface, said at least one transducer comprised of a layer of aluminum doped with copper, said layer having titanium distributed substantially uniformly therethrough.

2. The device as recited in claim 1 wherein the percentage of titanium comprising the at least one transducer is between 0.1% and 5.0%.

3. The device as recited in claim 1 wherein the percentage of copper comprising the at least one transducer is between 0.1% and 1.0%.

4. The device as recited in claim 1 wherein the substrate is comprised of a rotated y-cut of quartz.

5. A surface acoustic wave resonator device comprising:
    a substrate having a surface which supports surface acoustic wave propagation;
    a pair of reflective gratings disposed in said surface acoustic wave propagation surface; and
    an input transducer and an output transducer coupled to said surface acoustic wave propagation surface, disposed between the pair of reflective gratings, each transducer having conductive members comprised of a layer of aluminum doped with copper, said layer having titanium distributed substantially uniformly therethrough.

6. The device as recited in claim 5, wherein the percentage of titanium comprising the input transducer and the output transducer is between 0.1% and 5.0%.

7. The device as recited in claim 5 wherein the percentage of copper comprising the input transducer and the output transducer is between 0.1% and 1.0%.

8. The device as recited in claim 5 wherein the substrate is comprised of a rotated Y-cut of quartz.

9. A method of providing surface acoustic wave devices comprising the steps of:
    providing a substrate having a surface which supports surface acoustic wave propagation; and
    providing at least one transducer supported by said surface acoustic wave propagation surface of said substrate further comprising the steps of:
    depositing a first predetermined amount of titanium over said surface;
    depositing a second predetermined amount of aluminum doped to a predetermined percentage with copper over said surface; and
    heating said surface acoustic wave device to an elevated temperature.

10. The method as recited in claim 9 wherein the substrate is comprised of a rotated Y-cut of quartz.

11. The method as recited in claim 9 wherein the first predetermined amount yields a percentage of between 0.1% and 5.0% of titanium in the at least one transducer.

12. The method as recited in claim 9 wherein the predetermined percentage of copper in the at least one transducer is between 0.1% and 1.0%.

13. The method as recited in claim 9 wherein the surface acoustic wave device is heated to a temperature in excess of 350° C.

14. An oscillator circuit comprising:
    a signal amplifier;
    a surface acoustic wave device comprising:
        a substrate having a surface which supports surface acoustic wave propagation; and
        at least one transducer supported by the surface acoustic wave propagation surface, said at least one transducer comprised of a layer of aluminum doped with copper, said layer having titanium distributed substantially uniformly therethrough;
    means for adjusting the phase of a signal; and
    means for coupling a signal to an output of the circuit, such means electrically coupled to said signal amplifier and said surface acoustic wave device.

15. The circuit as recited in claim 14 wherein the percentage of copper comprising the at least one transducer is between 0.1% and 1.0%.

16. The circuit as recited in claim 14 wherein the percentage of titanium comprising the at least one transducer is between 0.1% and 5.0%.

* * * * *